(12) United States Patent
Cox et al.

(10) Patent No.: US 6,712,020 B2
(45) Date of Patent: Mar. 30, 2004

(54) TOROIDAL PLASMA SOURCE FOR PLASMA PROCESSING

(75) Inventors: Michael S. Cox, Davenport, CA (US); Canfeng Lai, Fremont, CA (US); Robert B. Majewski, Felton, CA (US); David P. Wanamaker, San Jose, CA (US); Christopher T. Lane, San Jose, CA (US); Peter Loewenhardt, San Jose, CA (US); Shamouil Shamouilian, San Jose, CA (US); John P. Parks, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/170,827

(22) Filed: Jun. 12, 2002

(65) Prior Publication Data

US 2002/0157793 A1 Oct. 31, 2002

Related U.S. Application Data (62) Division of application No. 09/584,167, filed on May 25, 2000, now Pat. No. 6,418,874.

(51) Int. Cl.$^7$ ............................ C23C 16/00; H05H 1/00
(52) U.S. Cl. ................ 118/723 I; 118/723 IR; 156/345.48
(58) Field of Search ............ 118/723 I, 723 IR, 118/723 AN, 723 ER; 156/345.48, 345.35; 315/111.51, 111.71, 111.21, 111.41; 204/298.16, 298.37

(56) References Cited

U.S. PATENT DOCUMENTS

| | | |
|---|---|---|
| 2,344,138 A | 3/1944 | Drummond |
| 3,109,100 A | 10/1963 | Papp |
| 3,291,715 A | 12/1966 | Anderson |
| 4,086,506 A | 4/1978 | Kustom et al. |
| 4,277,306 A | 7/1981 | Ohkawa |
| 4,431,898 A | 2/1984 | Reinberg et al. |
| 4,585,986 A | 4/1986 | Dyer |
| 4,666,734 A | 5/1987 | Kamiya et al. |

(List continued on next page.)

FOREIGN PATENT DOCUMENTS

| | | |
|---|---|---|
| EP | 0 546 852 | 6/1993 |
| EP | 0 836 218 | 4/1998 |
| JP | 2-260399 | 10/1990 |
| JP | 5-144594 | 6/1993 |
| JP | 5-166595 | 7/1993 |
| JP | 2000-71081 | 3/2000 |
| WO | WO 90/10945 | 9/1990 |
| WO | WO 99/00823 | 1/1999 |
| WO | WO 01/11650 A1 | 2/2001 |

OTHER PUBLICATIONS

Dean et al., "Status and Objectives of Tokamak Systems for Fusion Research," *USERDA Report WASH–1295*, (1974) (available from the Superintendent of Documents, U.S. Government Printing Office) pp. i–106.

Furth, H.P., "Tokamak Research," *Nuclear Fusion*, (1975) 15:487–534.

(List continued on next page.)

*Primary Examiner*—Parviz Hassanzadeh
(74) *Attorney, Agent, or Firm*—Townsend & Townsend & Crew (57) ABSTRACT

A toroidal plasma source (28) within a substrate processing chamber (10). The toroidal plasma source forms a poloidal plasma with theta symmetry. The poloidal plasma current is essentially parallel to a surface of the plasma generating structure, thus reducing sputtering erosion of the inner walls. The plasma current is similarly essentially parallel to a process surface (32) of a substrate (34) within the chamber. In a further embodiment, a shaped member (66) between the substrate and the plasma source controls the plasma density in a selected fashion to enhance plasma processing uniformity.

9 Claims, 9 Drawing Sheets

U.S. PATENT DOCUMENTS

| | | |
|---|---|---|
| 4,713,208 A | 12/1987 | Furth et al. |
| 4,778,561 A | 10/1988 | Ghanbari |
| 4,859,399 A | 8/1989 | Bussard |
| 4,863,671 A | 9/1989 | Okada |
| 4,867,859 A | 9/1989 | Harada et al. |
| 4,868,919 A | 9/1989 | Tanaka et al. |
| 4,871,421 A | 10/1989 | Ogle et al. |
| 4,948,458 A | 8/1990 | Ogle |
| 5,014,321 A | 5/1991 | Klein |
| 5,041,760 A | 8/1991 | Koloc |
| 5,061,838 A | 10/1991 | Lane et al. |
| 5,107,201 A | 4/1992 | Ogle |
| 5,174,875 A | 12/1992 | Hurwitt et al. |
| 5,277,751 A | 1/1994 | Ogle |
| 5,279,669 A | 1/1994 | Lee |
| 5,290,382 A | 3/1994 | Zarowin et al. |
| 5,435,881 A | 7/1995 | Ogle |
| 5,464,476 A | 11/1995 | Gibb et al. |
| 5,505,780 A | 4/1996 | Dalvie et al. |
| 5,514,246 A | 5/1996 | Blalock |
| 5,560,776 A | 10/1996 | Sugai et al. |
| 5,591,493 A | 1/1997 | Paranjpe et al. |
| 5,619,103 A | 4/1997 | Tobin et al. |
| 5,632,869 A | 5/1997 | Hurwitt et al. |
| 5,683,517 A | 11/1997 | Shan |
| 5,734,353 A | 3/1998 | Van Voorhies |
| 5,811,022 A | 9/1998 | Savas et al. |
| 5,897,752 A | 4/1999 | Hong et al. |
| 5,939,886 A | 8/1999 | Turner et al. |
| 5,944,942 A | 8/1999 | Ogle |
| 5,948,168 A | 9/1999 | Shan et al. |
| 5,994,236 A | 11/1999 | Ogle |
| 5,998,933 A * | 12/1999 | Shun'ko ............... 315/111.51 |
| 6,150,628 A | 11/2000 | Smith et al. |
| 6,164,240 A | 12/2000 | Nikulin |
| 6,374,831 B1 | 4/2002 | Chandran et al. |
| 6,392,351 B1 * | 5/2002 | Shun'ko ............... 315/111.51 |

OTHER PUBLICATIONS

Eckert, H.U., "Induction Plasmas at Low Frequencies," *AIAA Journal*, (Aug. 1971) vol. 9, No. 8, pp. 1452–1456.

Hagler et al., "An Introduction to Controlled Thermonuclear Fusion," *Library of Congress Cataloging in Publication Data*, (1977) pp. 59–61 and 178.

Kändler et al., "Characterization of plasma in an inductively coupled high–dense plasma source," *Surface & Coatings Technology*, (1995) 74–75, pp. 539–545.

B.C. Zhang et al., "A High Power Radio Frequency Transformer for Plasma Production in a Toroidal Plasma Source," *Rev. Sci. Instrum.*, vol. 69, No. 1, pp. 101–108 (Jan. 1998).

* cited by examiner

TOROIDAL PLASMA SOURCE FOR PLASMA PROCESSING

CROSS-REFERENCES TO RELATED APPLICATIONS

This application is a division of U.S. application Ser. No. 09/584,167, filed May 25, 2000 now U.S. Pat. No. 6,418,874, which is incorporated herein by reference.

BACKGROUND OF THE INVENTION

The present invention relates to substrate processing equipment and more particularly to plasma processing equipment for performing plasma processing steps, such as deposition, clean, and/or etch processes on a process substrate.

Plasma processing methods are used in the fabrication of semiconductor devices, such as integrated circuits, and other types of substrates, such as micro-electro-mechanical ("MEMs") substrates to achieve a variety of results. Plasma methods include the formation of a layer using plasma-enhanced chemical vapor deposition and etching techniques, such as reactive ion etching. Additionally, a plasma might be used to clean a processing chamber or to prepare a surface of a substrate for a subsequent process step, such as a plasma wafer surface clean or activation prior to formation of a layer on the surface.

The wide application of plasma processing has resulted in a wide variety of plasma processing systems and apparatus. One type of plasma processing chamber places the wafer on an electrode of the plasma circuit, opposite another planar electrode, and capacitively couples high-frequency electrical power to the two electrodes to form a plasma between them. Such a plasma reactor has advantages where it is desirable to form the plasma in the presence of the substrate, such as when the physical movement of plasma species to and from the substrate is desired. However, some devices or materials might not be compatible with this type of plasma formation, particularly the bombardment by plasma species, including high-energy photons, and associated heating of the substrate.

Another approach to plasma processing generates plasma in a remote location, and couples the plasma to a processing chamber. Various types of plasma generators have been developed, including magnetron sources coupled to a cavity, inductively coupled toroidal sources, microwave irradiation directed at a plasma precursor, electron-cyclotron resonance generators, and others. Remote plasma techniques offer a number of advantages for certain types of processes, such as cleaning deposition chambers, but generally the atomic species that eventually reach the chamber are of relatively low density, due to recombination of the reactive plasma species with each other or with components of the processing system, such as the chamber walls or delivery conduit.

Inductively coupled plasma systems have been developed that can generate a high-density plasma in one portion of the processing chamber (e.g. above the wafer), yet shield the wafer from the more deleterious effects of the plasma generation process by using the plasma itself as a buffer between the wafer and the plasma generation region and typically relies on diffusion of plasma to provide a uniform ion density across the wafer surface. In one system, a dielectric dome, or chamber top, has a conductive coil wound around the dome. High-frequency electric energy provided to the coil couples to a plasma precursor gas in the chamber and converts the precursor to plasma. In some systems, a second power supply couples an alternating field to the wafer or wafer support structure, and allows a directional component to and from the wafer to be added to the plasma generated by the coils. Such systems are used for both deposition and etch processes to achieve desirable results, generally providing both high rates and good uniformity across a wafer.

However, the fields generated by the coil through the dome have an electric field component normal to the surface of the dome that causes plasma species to be directed to and from the inner surface of the dome. This field component acting on the plasma can cause physical erosion ("sputtering") of the inside of the dome, as well as affect the power coupling to the plasma, thus causing a non-uniform plasma density. In some instances the plasma might contain species that react with the material of the dome, further eroding the dome and potentially creating particles than can fall from the dome onto the wafer, creating defects. Reaction of the dome material with the plasma often arises in an etch process when the material being etched is similar to the material of the dome, e.g. silica-based glass. If erosion of the inner surface of the dome continues to a point where particulate contamination or strength of the dome is an issue, the dome might have to be replaced, affecting through-put of the plasma system, and potentially disrupting the product flow through an entire fabrication line.

Thus, it is desirable to provide a plasma processing system that avoids the surface erosion problem of conventional systems while creating a high-density, uniform plasma.

BRIEF SUMMARY OF THE INVENTION

The present invention provides a plasma processing apparatus applicable to deposition, etch, and/or cleaning processes. Such processes may be applied to a substrate, such as a silicon wafer, composite wafer, glass panel, or other materials. In some instances, the plasma generated by the apparatus might be used for chamber cleaning purposes, in the absence of a substrate.

In one embodiment of the invention, a toroidal plasma source within a plasma processing chamber forms a poloidal plasma current. The toroidal plasma source includes a transformer having a primary circuit including a coil or coupling structure, a toroidal core, and a secondary circuit, when in operation, of plasma within the chamber. In a particular embodiment, a ferrite core contained within the processing chamber is approximately circular, resulting in a plasma having theta symmetry. In an alternate embodiment, the primary coil forms a toroid, with an "air" core. When processing a substrate, the process surface of the substrate can be oriented in a plane essentially parallel to the plane of the toroidal plasma source, taking advantage of the theta symmetry for improved process uniformity. The electric field that sustains the plasma is substantially parallel to all surfaces of the chamber, creating the poloidal current, thus reducing or eliminating reactive ion etching or sputtering of the surfaces of the chamber. The poloidal plasma current minimizes sputtering erosion of the chamber components surrounding the plasma source, as well as the surface of the substrate.

In a further embodiment, an AC or DC bias field can be applied to the substrate, relative to the plasma, to further control the interaction of the plasma with the surface of the substrate. In another embodiment, a shaped surface between the toroidal core and the process surface of the substrate modifies the plasma density in a selected fashion, typically along a radius of the substrate surface. For example, the cross section of the plasma conduit path around the toroidal plasma source could be narrowed near the outer perimeter of the substrate to increase plasma density in this region.

These and other embodiments of the present invention, as well as its advantages and features are described in more detail in conjunction with the text below and attached figures.

DETAILED DESCRIPTION OF THE INVENTION

I. Introduction

The present invention produces in-situ plasma using a toroidal core having a major plane essentially parallel to a processing surface of a process substrate. The in-situ toroidal configuration produces field lines predominantly parallel to, rather than perpendicular to, the interior chamber surfaces separating the coupling structure from the plasma. The parallel configuration of the toroid to the surface of the substrate provides poloidal ion flow with symmetry about the center axis of the toroid, resulting in improved process uniformity.

II. Exemplary Substrate Processing System

Figure 1:
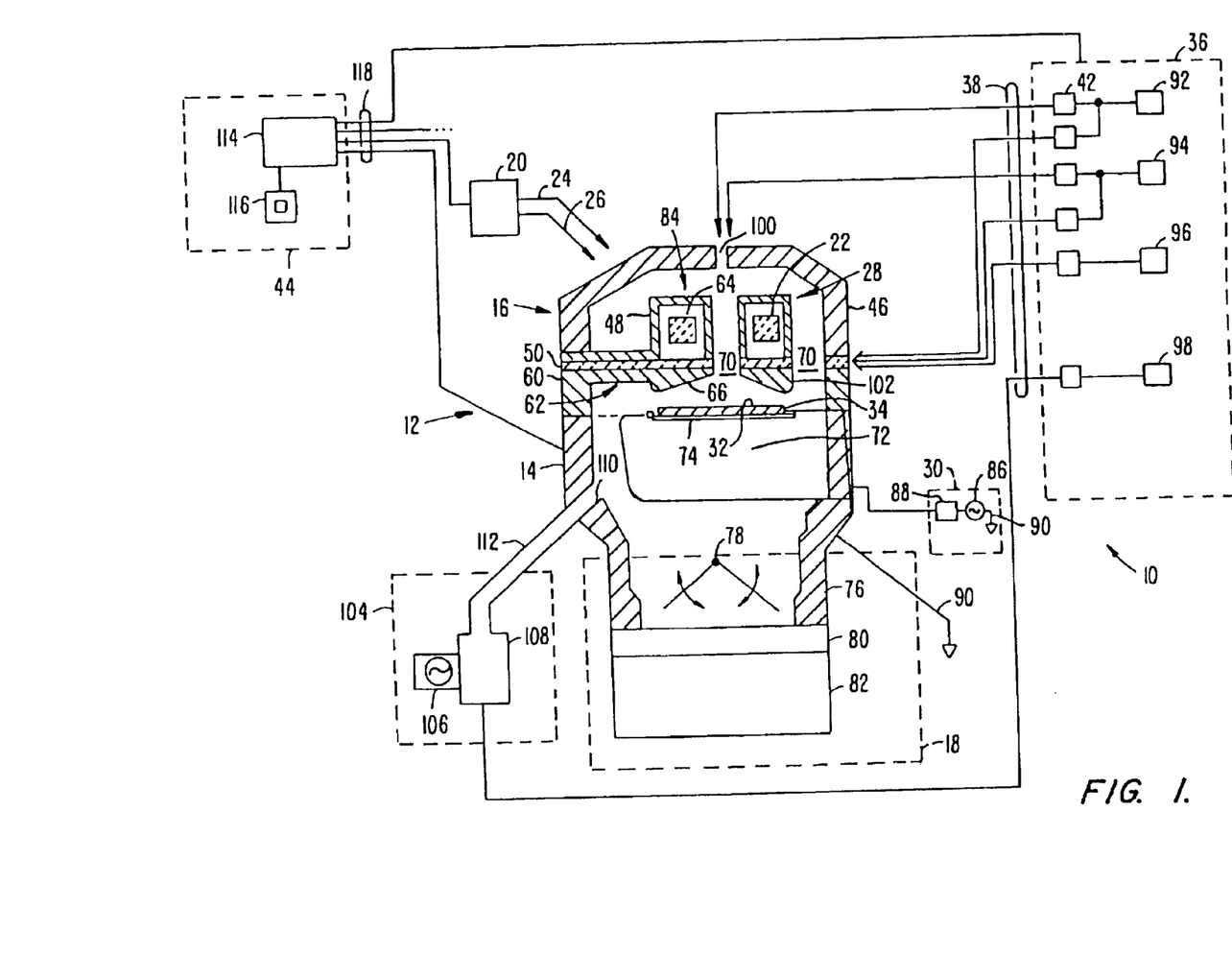
FIG. 1 is a simplified diagram of one embodiment of a high density chemical vapor deposition system according to an embodiment of the present invention.

FIG. 1 illustrates one embodiment of a plasma processing system 10 suitable for a variety of plasma processes, such as plasma-enhanced deposition processes and plasma etch processes. Plasma processing system 10 includes a chamber 12 having a chamber body 14 and a chamber top 16, a vacuum system 18, an RF generator (power supply) 20 coupled to a toroidal core 22 by leads 24, 26 by a coil (not shown). In one embodiment the toroidal core 22 is a ferrite core, but could be other magnetic material, or merely free space ("air") depending on the coupling structure. A bias plasma system 30 is optional for producing movement in the plasma normal to the surface 32 of a substrate 34. The substrate could be a silicon wafer, for example, or other substrate. For ease of description, the surface 32 will be referred to as the "process surface" of the substrate. It is understood that the process surface may include layers and structures previously formed on the substrate. In certain embodiments, the wafer is a silicon wafer with a nominal diameter of 200 mm or 300 mm.

A gas delivery system 36 provides gas(es) to the processing chamber and other system components through gas delivery lines 38, only some of which might be shown. Typical gases provided by the gas delivery system 36 might include plasma precursor gases, such as a cleaning or etching plasma precursor gas, a plasma deposition precursor gas, plasma striking gas, plasma dilution gas, and other gases, such as a cleaning precursor gas provided to an optional remote plasma cleaning system 140 for example. The delivery lines generally include some sort of control, such as a mass flow controller 42 and shut-off valves (not shown). The timing and rate of flow of the various gases is controlled through a system controller 44, as will be described in further detail below.

The chamber top 16 includes an outer shell 46, a toroid cover 48, an insulative spacer 50, and a bottom plate 60. The bottom plate may be shaped to provide a selected plasma density distribution. The outer shell, toroid cover, and bottom plate can be made of aluminum, anodized aluminum, stainless steel, or other material as appropriate for the intended processes to be performed. A surface coating can be applied to the inner surfaces of some chamber components, if desired, to reduce the potential for contamination of the substrate or chamber. The insulative spacer 50 is typically made from a dielectric material such as ceramic, for example alumina-based ceramic or aluminum nitride, silicon, or fused silica. It is generally desirable that the insulative spacer prevents substantial induced current flow between the chamber body 14 and any electrically conductive parts of the chamber top 16. In a particular embodiment, the insulative spacer is high-alumina ceramic about 20 mm thick.

The toroid cover 48 contains a toroidal core 22. In one embodiment the toroidal core is made of a ferrite material, such as a material sold under the trade designation "3F3" by ROYAL PHILIPS ELECTRONICS, N.V., but other ferrites or materials, such as iron, or air, may be appropriate. The RF generator is coupled to the core by coiling the leads 24, 26 around the core (see FIG. 5). Alternative and equivalent coupling structures will be apparent to those skilled in the art. Although two leads are shown connecting the RF generator to the core, an alternative circuit configuration using a single lead and common ground could be used. Specifically, the RF generator could be mounted directly on the chamber structure, thus avoiding long leads to the coil and associated electromagnetic radiation, as well as reducing variations in load resulting from long leads and eliminating the RF matching network. The core, coil, and generated plasma form a transformer circuit that operates as a toroidal plasma source 28 within the processing chamber when in operation. The primary circuit of the transformer is the coil, with the plasma serving as the secondary circuit of the transformer, the primary coupling to the secondary through the core.

The entire transformer (plasma source) is within the processing chamber. As described above, the outer shell 46 and chamber body 14 can be made of a conductive material, thus serving as a shield for electronic emissions generated by the toroidal plasma source 28. This not only reduces unwanted emissions from the system, but also may allow the RF generator 20 to operate at frequencies that would otherwise generate an unacceptable level of electronic noise emissions. In such an embodiment, it may be desirable to provide leads from the RF generator to the chamber that are shielded. Additional shielding may be appropriate around dielectric elements, such as the insulative spacer.

In a preferred embodiment the leads are lead through a toroidal plasma source support structure, such as a spoke 62. For example, the leads could come through the bottom plate and then into the toroidal cavity 64 containing the toroidal core 22. Alternatively, support for the toroidal plasma source could be provided by support structure(s) dropping down from the chamber top. In a preferred embodiment, (not illustrated in FIG. 1) four spokes support the toroidal core, shaped (center) portion 66 of the bottom plate 60 and toroid cover 48 in the interior of the chamber 70. The cross section illustrated in FIG. 1 is consistent with a 1, 3, 5, etc. spoke pattern. In an alternative embodiment, the leads are brought through a feed-through (not shown) in the outer shell 46 and through the toroid cover 48.

The chamber body 14 includes a substrate support member 72, which is mounted on, and forms a continuous inner surface with, the body. Substrates are transferred into and out of chamber by a robot blade (not shown) through an insertion/removal opening (not shown) in the side of the chamber. Motor-controlled lift pins (not shown) are raised and then lowered to transfer the substrate from the robot blade to the substrate support member 72. A substrate receiving portion 74 of the substrate support member can include a wafer hold-down apparatus, such as an electrostatic chuck (not shown), that can selectively secure the substrate to the substrate support member during substrate processing, if desired. In a preferred embodiment, the substrate support member 72 is made from anodized aluminum, aluminum, or aluminum oxide. The substrate support member may also include a heater (not shown) to heat the wafer during processing, or to heat portions of the chamber during a cleaning process. In a preferred embodiment, the substrate support member holds the substrate 36 so that the processing surface 34 of the substrate is opposite and essentially parallel to the major plane of the toroid. That is, the processing surface faces the loop described by the toroidal core.

The vacuum system 18 includes throttle body 76, which houses twin-blade throttle valve 78 and is attached to gate valve 80 and turbo-molecular pump 82. It should be noted that throttle body 76 offers minimum obstruction to gas flow, and allows symmetric pumping, as described in co-pending, co-assigned U.S. patent application Ser. No. 08/712,724 entitled SYMMETRIC CHAMBER by Ishikawa, filed Sep. 11, 1996, and which is incorporated herein by reference. The gate valve can isolate the turbo-molecular pump from the throttle body, and can also control chamber pressure by restricting the exhaust flow capacity when the throttle valve 78 is fully open. The arrangement of the throttle valve, gate valve, and turbo-molecular pump allow accurate and stable control of chamber pressures from between about 1 millitorr to about 2 Torr. It is understood that other types of vacuum pumps and configurations of vacuum systems could be used with alternative embodiments of the present invention.

The RF generator 20 operates at a nominal frequency of 400 KHz, but could operate at different frequencies, such as 60 Hz, 2 MHz, 13.56 MHz, 60 MHz, or 200 MHz among others, with appropriate design of the elements of the plasma system. The RF generator can supply up to 8 kW, but the processing system typically draws about 3–5 kW when processing a 200 mm wafer. It is understood that lower or higher power levels might be appropriate according to the type of process being performed and the size of the substrate.

A particular advantage of embodiments of the present invention utilizing a ferrite core is the relatively low quality factor ("Q") of the toroidal plasma generating structure 84, which includes the core, coil, and cover. The low Q also reduces the sensitivity of the plasma system to the chamber load, thus resulting in a more stable and consistent plasma operated over a wider process range. In a high-Q system, the power delivered to the plasma can vary as the plasma is formed or chamber conditions change. For example, a plasma might be initiated with a plasma striker gas, such as argon. When a precursor gas, such as $NF_3$ or $F_2$, is provided to the plasma, the dissociation of the gas into plasma creates a sudden increase in plasma species (pressure) as well as electrically charged particles. This effect can change the load on the power supply as well as the match to the load, resulting in reduced power transfer to the plasma and potentially reflecting a harmful level of power back to the generator. In the present invention, a low-Q system can be implemented, avoiding these problems.

A bias plasma system 30 includes a bias generator 86 and an optional bias matching network 88. The bias plasma system capacitively couples the substrate receiving portion 74, i.e. the substrate, to conductive (grounded) inner surfaces of the chamber through a common ground 90. The bias plasma system serves to enhance the transport of plasma species (e.g. reactive ions or other particles) created by the plasma generating structure 84 to the surface 32 of the substrate.

The gas delivery system 36 provides gases from several gas sources 92, 94, 96, 98 to the chamber and other system components via the gas delivery lines 38 (only some of which might be shown). Gases can be introduced into the chamber in a variety of fashions. For example, a top port 100 is shown as one example of a means of flowing gases into the chamber. A gas mixing chamber (not shown) can be present between the gas sources and the chamber, or the top port can be arranged with a number of parallel or concentric gas conduits to keep various gases separate until reaching the chamber. In an alternate embodiment, gas conduits are present in the spoke(s) supporting the toroidal plasma generating structure 84 and nozzles (ports) are provided in the center portion of the chamber top. In yet another alternative embodiment, a gas delivery ring with a series of gas nozzles is provided about an inner circumference of the processing chamber. If gas ports are provided in the outer perimeter portion 102 of the bottom plate 60, then it is generally desirable that the outer perimeter portion extend beyond the edge of the substrate, to reduce the chance of particles forming at the outer perimeter portion falling on the surface of the substrate.

An optional remote plasma cleaning system 104 is provided to periodically clean deposition residues from chamber components. The cleaning system includes a remote microwave generator 106 that creates a plasma from a cleaning gas source 98 such as molecular fluorine, nitrogen trifluoride, other fluorocarbons or equivalents, in a reactor cavity 108. The reactive species resulting from this plasma are conveyed to the chamber interior through cleaning gas feed port 110 via applicator tube 112.

The system controller 44 controls the operation of the plasma processing system 10. In a preferred embodiment, the system controller includes a processor 114 coupled to a memory 116, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller is coupled to other parts of the processing system by control lines 118 (only some of which might be shown), which may include system control signals from the controller and feedback signals from the system. The system controller conforms to the Versa Modular European (VME) standard, which defines board, card cage, and connector dimensions and types. The VME standard also defines the bus structure having a 16-bit data bus and 24-bit address bus. System controller 44 operates under the control of a computer program 119 stored on the hard disk drive or other computer programs, such as programs stored on a floppy disk. The computer program dictates, for example, the timing, mixture of gases, RF power levels and other parameters of a particular process. The interface between a user and the system controller is via a monitor (not shown), such as a cathode ray tube (CRT), and a light pen (also not shown).

It is specifically understood that other types of chambers might be adapted to a toroidal plasma source according to the present invention, and that different types of wafer support systems, such as a center pedestal, might be used, as well as different exhaust configurations, such as a perimeter exhaust configuration. In particular, additional coils might be added to control the plasma density and distribution (uniformity) inside the processing chamber. For example, instead of the metal outer shell described in conjunction with FIG. 1, a dielectric dome or shell could be used, and a coil provided outside the chamber, or a coupling structure (s), such as a pole face of a solenoid, could couple to the interior of the chamber through a chamber wall. Similarly, additional coils or other coupling structures could be provided within the chamber to manipulate the plasma. Such coils might lie above, below, or essentially co-planar with the toroidal plasma source.

III. Exemplary Process Flows

Figure 2:
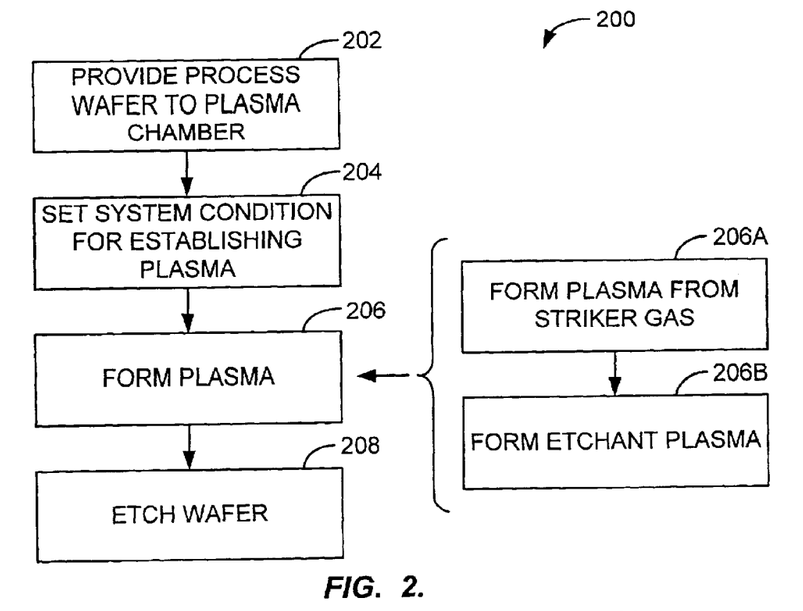
FIG. 2 is a simplified flow chart of an etching process according to an embodiment of the present invention.

FIG. 2 is a simplified flow chart representing an example of an etch process 200 according to an embodiment of the present invention. A wafer is provided in an appropriate plasma processing chamber (step 202). The wafer has a process surface essentially facing and parallel to a toroidal plasma source within the processing chamber. The configuration of the toroidal plasma source with respect to the process surface creates a poloidal plasma with theta symmetry, i.e. rotational symmetry about a center axis essentially normal to the process surface (the toroid axis). Chamber and/or substrate conditions are established for initiating a plasma (step 204). For example, the chamber pressure, initial gas flow rates, and wafer heating might be performed prior to initiating a plasma. A plasma is formed (step 206) in the chamber. In one embodiment, a plasma is first "struck" by a variety of known methods, such as by providing an electronic spark in the chamber in the vicinity of the plasma source, irradiating the gas in the chamber with ultra-violet ("UV") light, coupling a high-voltage signal between chamber components (e.g. between portions of the chamber separated by a dielectric spacer or between the wafer support structure and the toroidal plasma source). Striking the plasma can take as little as 500 ms, after which time the plasma is sustained by power from the toroidal plasma source. In one embodiment, the initial plasma is formed from a process gas, i.e. an etching plasma precursor such as dilute $F_2$, $NF_3$, $CF_4$, $C_3F_8$, $SF_6$ for etching silicon glass layers or cleaning glass residue from the chamber interior. Other etching plasma precursors might be appropriate for etching other types of materials, as are known in the art.

In an alternative embodiment, an initial plasma is formed from a plasma striker gas, such as argon, which is easily ionized to form a stable plasma (step 206A), and the etching plasma precursor is flown into the chamber to form an etching plasma (step 206B). In yet another embodiment, argon and a halogen-containing gas are simultaneously flown into the chamber to form the etching plasma. The substrate is then etched (step 208). A similar process flow could be used to clean a chamber or treat the surface of the wafer, for example.

Figure 3:
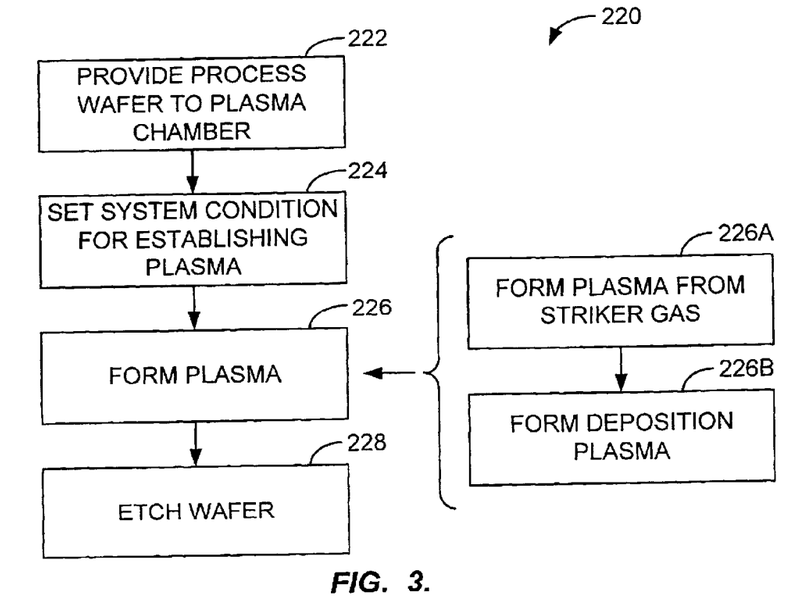
FIG. 3 is a simplified flow chart of a deposition process according to an embodiment of the present invention.

FIG. 3 is a simplified flow chart representing an example of deposition process 220 according to an embodiment of the present invention. A wafer is provided in an appropriate plasma processing chamber (step 222). The wafer has a process surface essentially facing and parallel to a toroidal plasma source within the processing chamber. The configuration of the toroidal plasma source with respect to the process surface creates a poloidal plasma with theta symmetry, i.e. rotational symmetry about a center axis essentially normal to the process surface (the toroid axis). Chamber and/or substrate conditions are established for initiating a plasma (step 224). For example, the chamber pressure, initial gas flow rates, and wafer heating might be performed prior to initiating a plasma. A plasma is formed (step 226) in the chamber and sustained by power delivered through the toroidal plasma source. In one embodiment, the initial plasma is formed from a process gas, i.e. a deposition plasma precursor(s) such as silane and oxygen for depositing a silicon glass layer on the process surface. Other deposition plasma precursors might be appropriate for depositing other types of materials, as are known in the art.

In an alternative embodiment, the initial plasma is formed from a plasma striker gas, such as argon, which is easily ionized to form a stable plasma (step 226A), and the deposition plasma precursor(s) is flown into the chamber to form a deposition plasma (step 226B). In yet another embodiment, argon and a deposition precursor gas are simultaneously flown into the chamber to form the deposition plasma. The desired layer or film is then formed on the substrate (step 228).

IV. Further Embodiments of the Invention

Figure 4A:
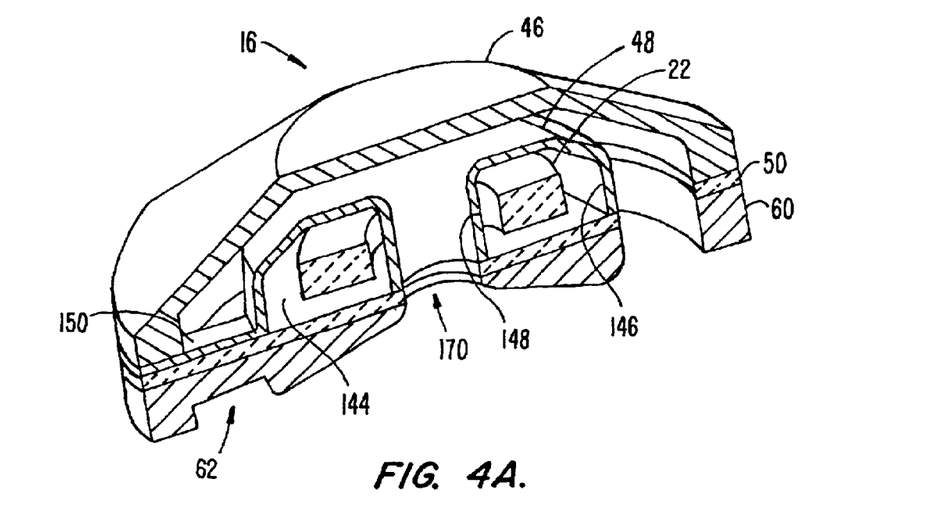
FIG. 4A is a simplified cut-away perspective view of a chamber top according to an embodiment of the present invention.

FIG. 4A is a simplified cut-away perspective view of a chamber top 16 (shown in FIG. 1) according to an embodiment of the present invention. An outer shell 46 of aluminum rests on a spoke portion 62 of the toroid cover 48. An insulative spacer 50 electrically isolates the outer shell and toroid cover from the bottom plate 60 and other conductive chamber components to reduce eddy currents in the walls of the chamber. It is understood that the insulative spacer need not be placed where shown, and might not be necessary in some instances, such as when the outer shell is a dome of dielectric material. The toroid cover 48 is also anodized aluminum. The present invention recognizes that the toroid cover can be made of an electrically conductive material, preferably with low magnetic permeability, and does not need to be a dielectric material. The bottom plate 60 is also anodized aluminum. Other materials, such as aluminum, fused silica or ceramic, could be used, but making the bottom plate out of an electrically conductive material provides a surface that is easy to thermo-regulate and electrically grounded.

A gap 144 is provided in the toroidal cavity between the ferrite core 22 and the inner wall 146 of the toroid cover. This gap allows for cooling of the ferrite core and coil (not shown) with a fluid, such as water, air, nitrogen gas, or helium gas, if desired. The cooling fluid could be provided through a spoke, or thorough separate conduits, such as tubes extending through the top portion of the outer shell to the interior of the toroid cover. Cooling fins (not shown)

could be added to the interior of the toroid cover to further facilitate cooling through increased surface heat transfer and/or cooling fluid mixing. Alternatively, the toroid cover could be heated, such as with resistive wires or a heated fluid, to avoid deposition on selected outer surfaces of the toroid cover, for example.

A spoke portion 150 of the toroid cover is shown extending beneath the outer perimeter of the top cover 46. The top cover is held against the chamber body (not shown) with sufficient force to provide an adequate seal between the top cover 46 and the insulative spacer 50. In a further embodiment, the interior of the toroid cover is kept at a pressure slightly above the chamber pressure with a non-reactive gas to prevent plasma species from entering the toroidal space and potentially damaging the coupling structure (core and/or coils). Other techniques may be used to assemble the components of the top cover to a chamber body, or to hold portions of the toroid cover together. Additional seals may be added, as appropriate, and are not shown for purposes of clarity of illustration.

Figure 4B:
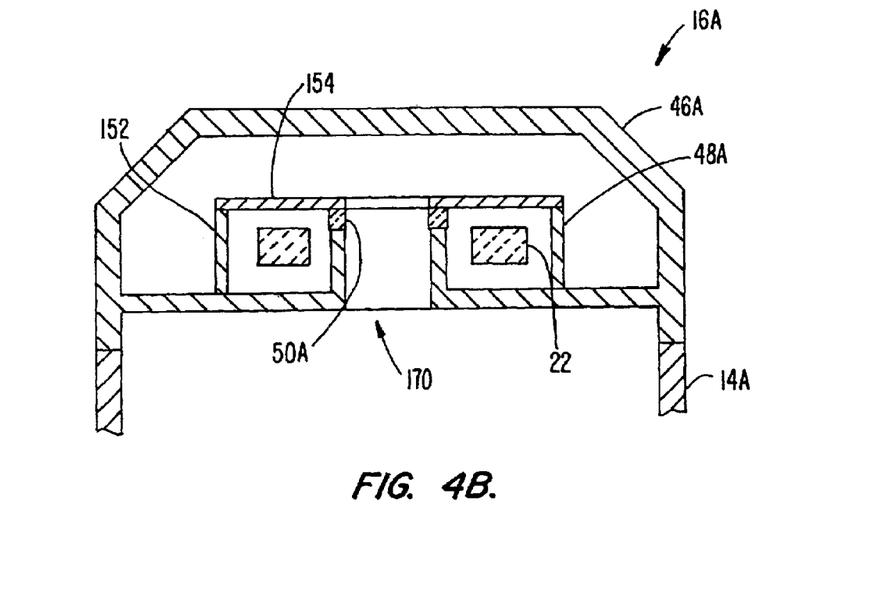
FIG. 4B is a simplified cross section of a chamber top according to an alternative embodiment of the present invention.

FIG. 4B is a simplified cross section of a chamber top 16A according to an alternative embodiment of the present invention. A toroid cover 48A is made of several parts, which can be bolted, welded, or otherwise fastened together, for example. A first insulative spacer 50A is provided between the chamber top 46A and the chamber body 14A. A second insulative spacer or gap may be provided in the potential conductive loop formed by the toroid cover, but is not required. It is specifically understood that a spacer is not required, and that a simple gap or break may suffice to avoid induced current loops. For example, the outer ring 152 or toroid cover top 154 could be made of a dielectric material. Note that this embodiment omits the bottom plate, particularly a shaped surface that would oppose a process surface of a substrate in the processing chamber.

Figure 4C:
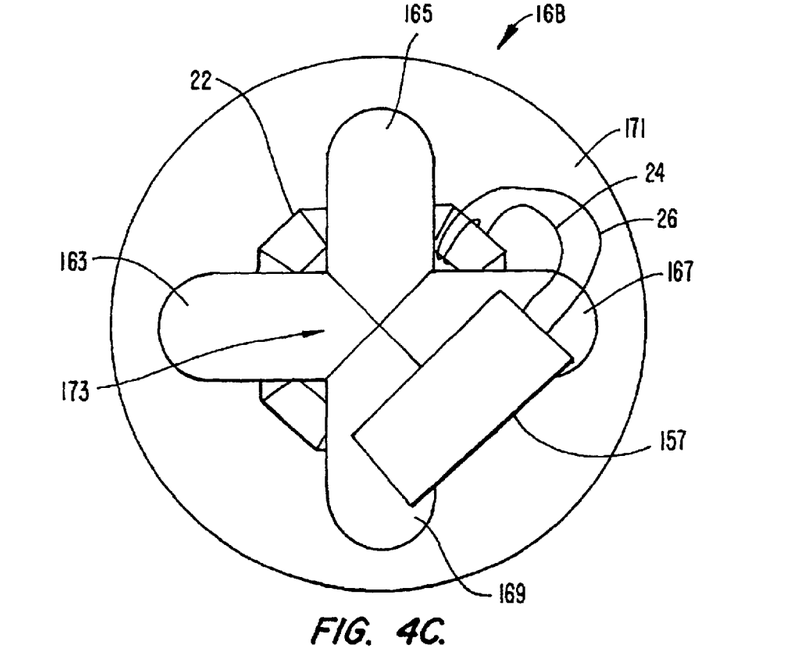
FIG. 4C is a simplified top view of a chamber top according to another embodiment of the present invention.

FIG. 4C is a simplified top view of still another alternative chamber top 16B according to another embodiment of the present invention. A number of tubes 163, 165, 167, 169 have been welded to and through a bottom plate 171. The core 22 surrounds a center manifold section 173 of the chamber top. The center manifold section includes a center tube (not shown in this view) that couples plasma current through the chamber around the core. An insulative spacer 50B avoids induced current loops in the chamber top. The position of the insulative spacer is merely exemplary, as discussed above.

Figure 4D:
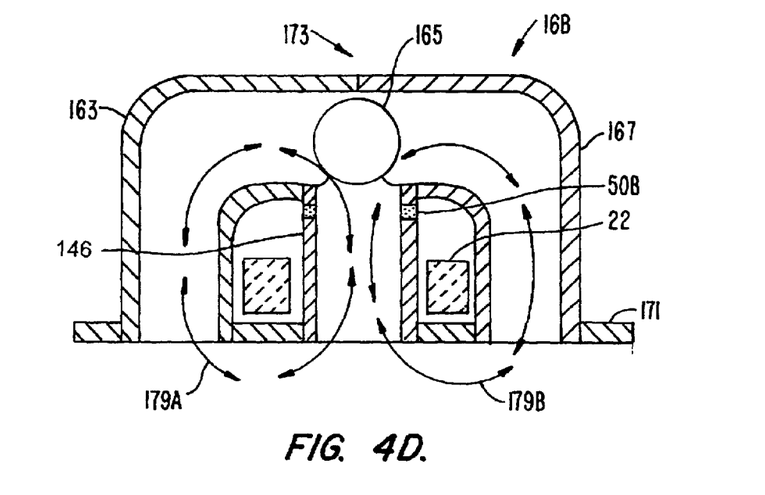
FIG. 4D is a simplified cross section of the chamber top shown in FIG. 4D.

The tubes allow plasma current to flow to and from the processing chamber around the core. The plasma current flows around first and second plasma path loops represented by double-ended arrows 179A and 179B (FIG. 4D). The other tubes similarly can complete a plasma path. A dielectric gap or insulative spacer 50B is provided in the center tube, but could be provided elsewhere to avoid induced currents in the tubes or bottom plate. The core lies "outside" of the vacuum chamber, but is topologically within the secondary loop of the transformer, as compared to the core shown in FIG. 1, which is inside of the chamber space formed by the chamber top and body. In other words, the chamber must be opened to remove the core in FIG. 1, whereas the segments of the core shown in FIG. 4C can be removed without removing the chamber top from the chamber body. The tubes allow the flow of plasma current around the core, similar to the toroid covers shown in FIGS. 4A and 4B. The number of tubes is exemplary only, and more or fewer tubes may be used. Additionally, the tubes do not need to be circular in cross section, or have a uniform cross section, e.g. a tube could have a circular cross section at the center end and an oval section at the perimeter end.

A further aspect of the chamber top is that a plasma source power supply 157 is mounted on the tubes. Alternatively, the power supply could be mounted on other tubes, elsewhere on the chamber top, or on the chamber body. Mounting the power supply on the chamber top or body is desirable to keep the leads 24, 26 short, thus reducing the length of the leads that need to be shielded or might otherwise emit undesired electrical signals. While a variety of power supplies might be small enough to be mounted on the chamber lid, the toroidal transformer configuration of the present plasma source allows relatively simple and compact power supplies to be used.

FIG. 4D is a simplified cross section of the chamber top 16B shown in FIG. 4C. The configuration of the tubes 163, 165, and 167 (the fourth tube 169 is not shown in this view) with respect to the bottom plate 171 is exemplary only. Welds between the tubes and vacuum plate form sealed joints sufficient for the intended chamber pressures and vacuums. The core 22 is provided in multiple segments of ferrite material so that it may be assembled around the center tube 175 after the tubes and plate have been assembled.

Figure 5:
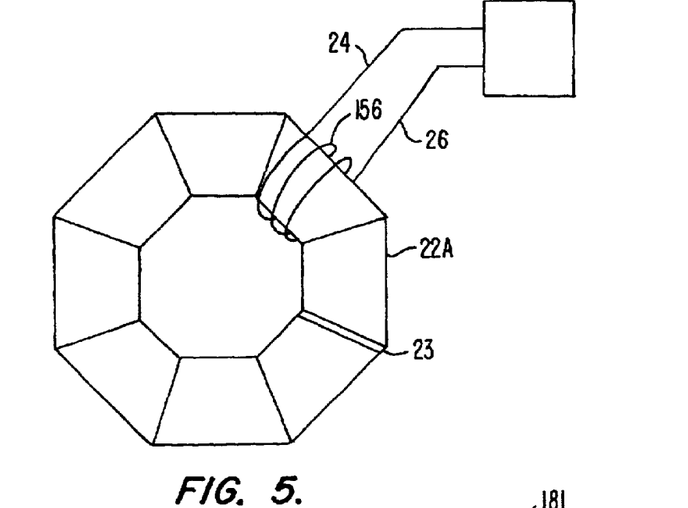
FIG. 5 is a simplified diagram of a core, coil, and power supply according to an embodiment of the present invention.

FIG. 5 is a simplified top view of a portion of the plasma system. A circular toroidal core is approximated with an octagonal ferrite core 22A. The octagonal ferrite core is fabricated from eight segments of ferrite bar cut to the appropriate length and angles. Providing a core in segments with one or more small gaps between them, rather than a unitary piece of ferrite, lowers the Q of the transformer, providing a plasma source that is less dependent on variations in the load. In a further embodiment, a non-magnetic spacer 23 or spacers may be added to the core between segments to further lower the Q. The spacers may have a thickness and number chosen according to the desired loss. A coil 156 attached to the RF generator 20 via the leads 24, 26 couples RF energy to the ferrite core. The number of turns in the coil is merely illustrative. In one embodiment the segments of the ferrite core have a rectangular cross section. In alternative embodiments, other cross sections could be used, such as a circular cross section. Additionally, the core might have a different configuration, such as two half circles segments, a single-piece torus, or four straight segments forming a square or rectangle, or other polygonal shape.

Figure 6:
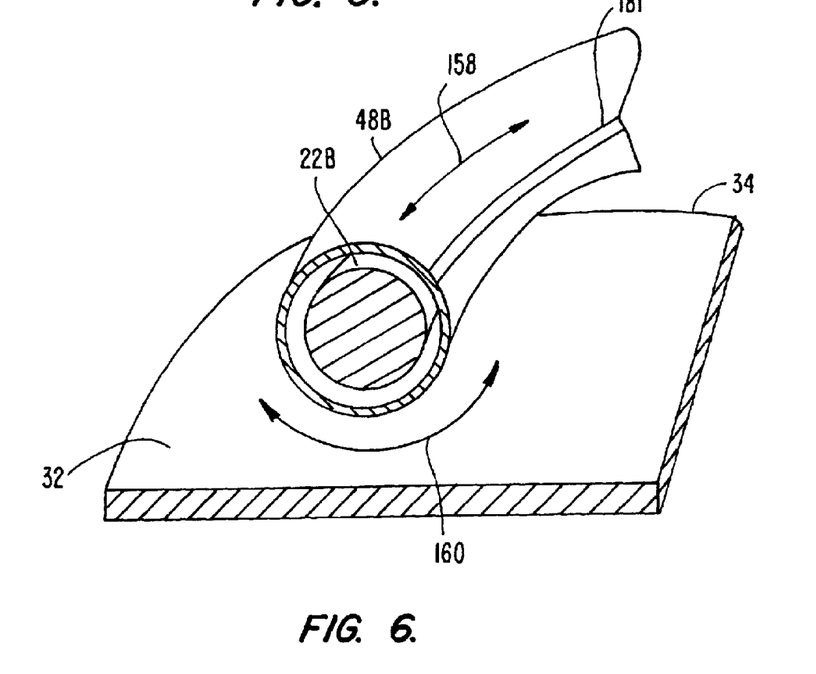
FIG. 6 is a simplified cut-away perspective view of a portion of a toroidal plasma source in relation to a processing surface of a substrate in accordance with an embodiment of the present invention.

FIG. 6 is a simplified cut away view of a portion of a toroidal plasma system in relation to a substrate. When RF energy is applied, an alternating magnetic field is set up in the core 22B, as represented by the first double-ended arrow 158. This causes a poloidal electric field (and plasma current) to result in the space surrounding the toroid, as represented by the second double-ended arrow 160. The poloidal electric field tends to move charged plasma species along the electric field lines, which in this case lie essentially parallel to a processing surface 32 of the substrate 34. Those in the art will appreciate that a normal component may be present, but this component will diminish with distance from the core, and may be controlled through the use of plasma-shaping techniques, such as a bottom plate, that is discussed in further detail below in reference to FIG. 8. Similarly, the electric field lines are essentially parallel to the surface of the toroid cover 48B, thus reducing sputtering attack and other plasma erosion mechanisms on the toroid cover. A gap or dielectric spacer 181 avoids current loops in the toroid cover 48B.

Figure 7:
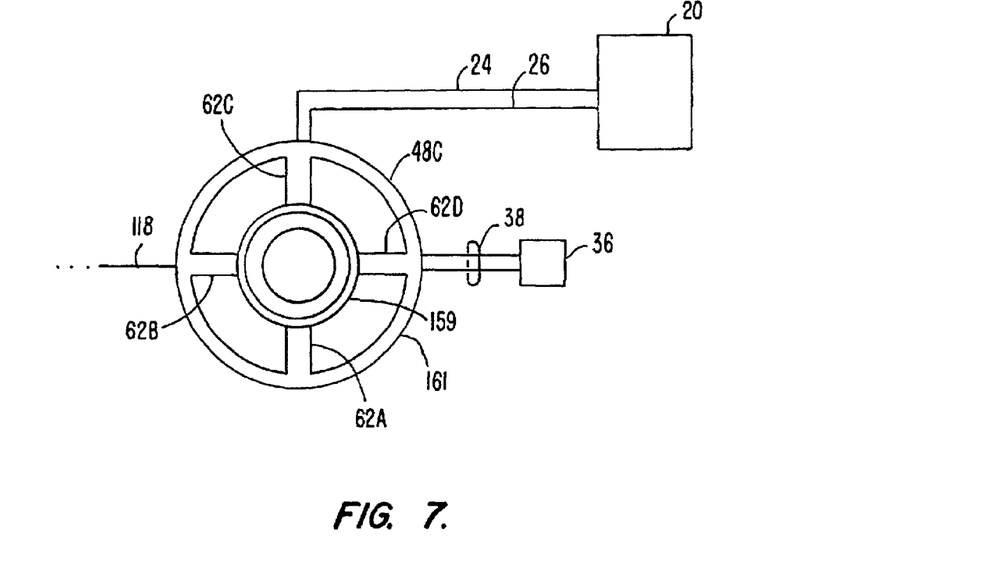
FIG. 7 is a simplified top view of a toroid cover and simplified illustration of associated facilities.

FIG. 7 is a simplified top view of a toroid cover 48C and related apparatus according to an embodiment of the present invention. The toroid cover has four spoke portions 62A, 62B, 62C, 62D connecting the inner portion 159 to a flange portion 161. Facilities may be lead through the spoke portions. For example, the leads 24, 26 from the RF generator 20 may be lead though a spoke portion 62C to connect to the coil (not shown) within the inner portion 159. Similarly, the gas delivery system 36 might deliver a process gas to the chamber or cooling gas to the toroid cover through conduits 38 in a second spoke portion 62D. Other facilities, such as process control signals 118 or heater current might be carried in a spoke portion.

Figure 8:
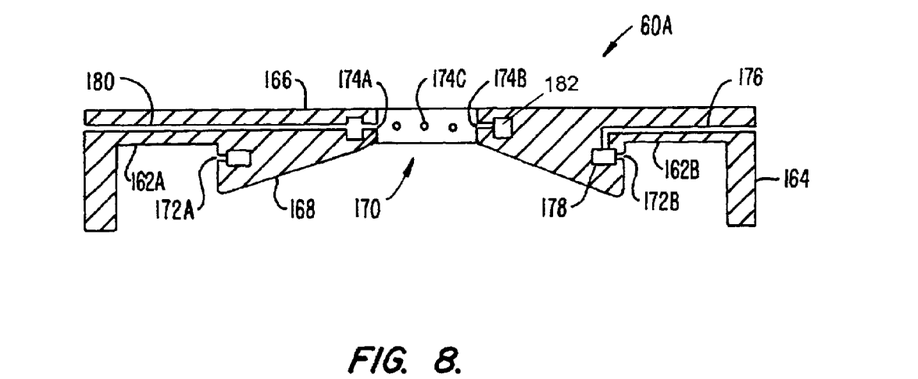
FIG. 8 is a simplified section of a shaped bottom plate according to an embodiment of the present invention.

FIG. 8 is a simplified cross section of a bottom plate 60A. The bottom plate includes a flange portion 164, spoke portions 162A, 162B, and a center portion 166. This bottom plate has four spokes (only two of which are shown in this cross section), as is consistent with the top cover described above in reference to FIG. 7, hence it is understood that the section shown as the spoke portions do not extend around the entire circumference of the bottom plate, thus allowing poloidal plasma flow about the toroidal plasma source. The center portion includes a shaped portion 168 and a center plasma conduit 170. It is understood that the center plasma conduit extends through the center of the entire toroidal plasma source, thus providing the poloidal plasma current path (see FIGS. 4A, 4B).

The shaped portion 168 has a cross section selected according to a desired plasma configuration (density distribution). For example, the exemplary shaped portion section is thinner near the center plasma conduit and thicker near the spoke portions. In a particular embodiment, this wedge-shaped section of the shaped portion serves to increase the plasma density, and hence activity on the surface of the substrate, with increasing radial distance from the center axis of the toroidal plasma source, relative to what the density would be without a shaped portion of the bottom plate. In practice, the plasma density modification achieved by the shaped portion results in an essentially uniform plasma density across the surface of the substrate in a radial direction. In some instances, non-uniform plasma densities might be desired. The configuration of the shaped portion is selected according to various process parameters and chamber conditions, such as gas flow and exhaust rates, chamber pressure, and plasma species, among others. For example, a different cross section might be appropriate for use with a higher flow rate or higher chamber pressure. Those skilled in the art will further appreciate that the appropriate cross section may depend on plasma density. Hence it is understood that the illustrated wedge-shape is provided as an example only.

The bottom plate 60A includes outer gas ports 172A, 172B and inner gas ports 174A, 174B, 174C. It is understood that a particular bottom plate might not include any gas ports, or only certain gas ports, including gas ports in different locations. A gas conduit 176 couples a gas source (not shown) to an outer plenum 178. The outer plenum is essentially circumferential within the bottom plate and supplies gas to the chamber through the outer gas ports. Similarly, a second gas conduit 180 is coupled to the same or another gas source and supplies gas or vapor to an inner plenum 182, which is also circumferential within the bottom plate. The second plenum provides gas to the chamber through the inner gas ports. A gap may be provided in the outer plenum, for example, allowing crossing of the second conduit. In a specific embodiment the outer gas ports do not overhang the wafer, allowing particles formed at or near these nozzles to avoid falling on the wafer.

It is generally desirable to avoid particulate formation on the inner gas ports 174A, 174B, 174C. In a particular silicon oxide deposition process, silane is dispensed from the outer gas ports and oxygen is dispensed from the inner gas ports. Alternatively, oxygen and silane are dispensed from the outer ports and either silane or oxygen is dispensed from the inner ports. In another deposition process, a fluorine-containing precursor is dispensed from the inner ports to form a fluorine silicon glass film. The fluorine assists in reducing particulate formation in the center plasma conduit region 170. Other methods may be employed, such as locally heating this region with an embedded resistance heater (not shown).

In still other embodiments of the invention, the inventors have developed modifications to the chamber design that can be used to alter properties of the generated plasma including plasma uniformity. FIGS. 9A–9F show examples of some of these modifications. The embodiment of the invention shown in FIG. 9A includes an internal coil 180. RF power can be applied to coil 180 from RF generator 20 or from a separate RF power supply. The embodiment of FIG. 9B, on the other hand, includes an external coil 182 that can be connected to RF generator 20 or another RF power supply. The use of an external coil requires outer shell 46 to be made from an RF transparent material such as an aluminum oxide or aluminum nitride ceramic dielectric. The embodiment of FIG. 9C includes a secondary toroidal plasma source. The secondary toroidal plasma source includes a magnetic toroidal core 184 and a toroidal cover 186. An insulative spacer (not shown) may also be included to prevent induced current flow as described above with respect to toroidal core 22 and toroidal cover 48. Toroidal core 184 can be connected to a lead of RF generator 20 or to another RF power supply by leads not shown in the figure.

Figure 9A:
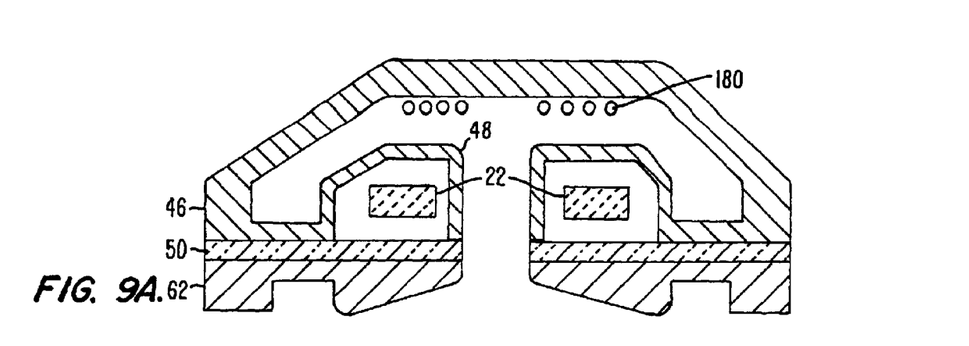
FIGS. 9A–9H are simplified vies of additional embodiments of the present invention.
Figure 9B:
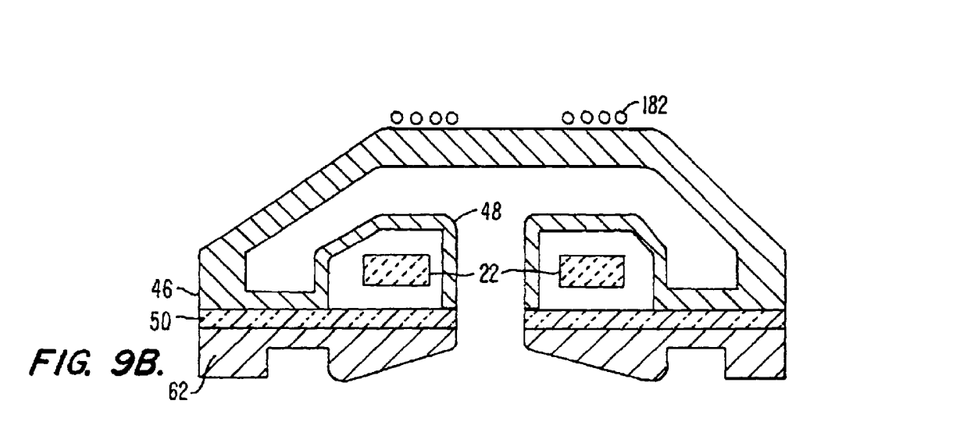
Figure 9C:
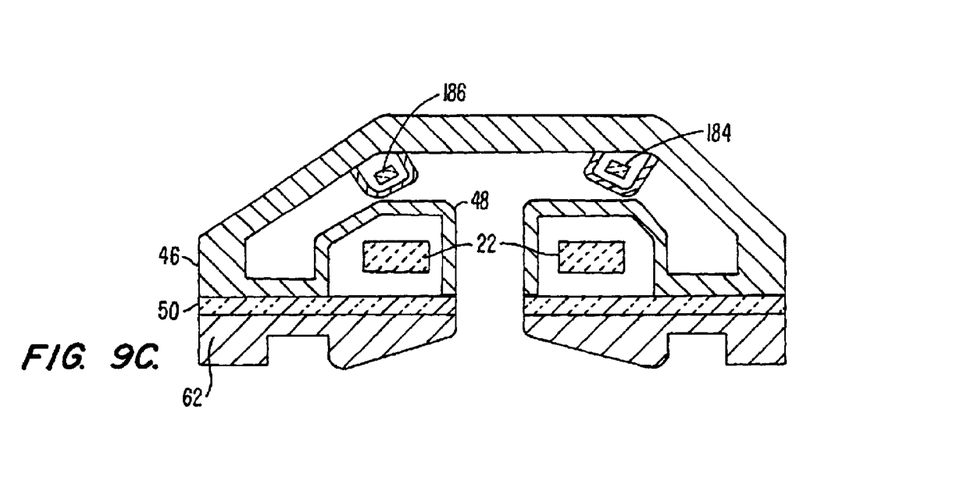
Figure 9D:
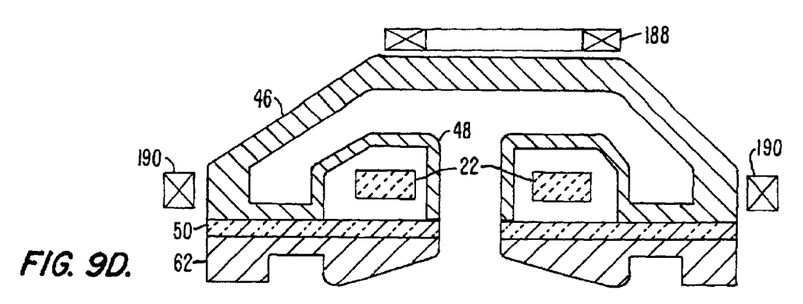
Figure 9E:
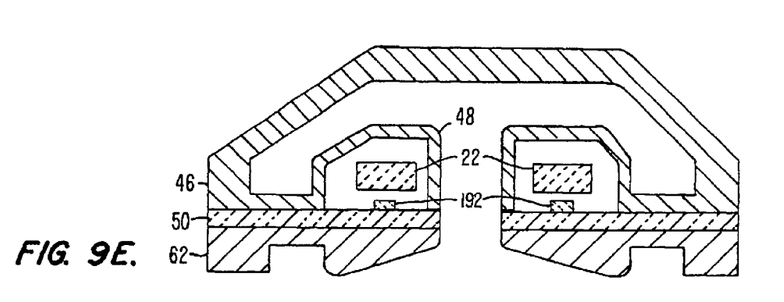
Figure 9F:
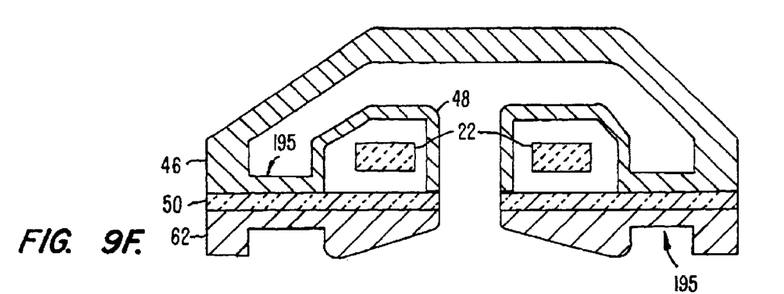
Figure 9G:
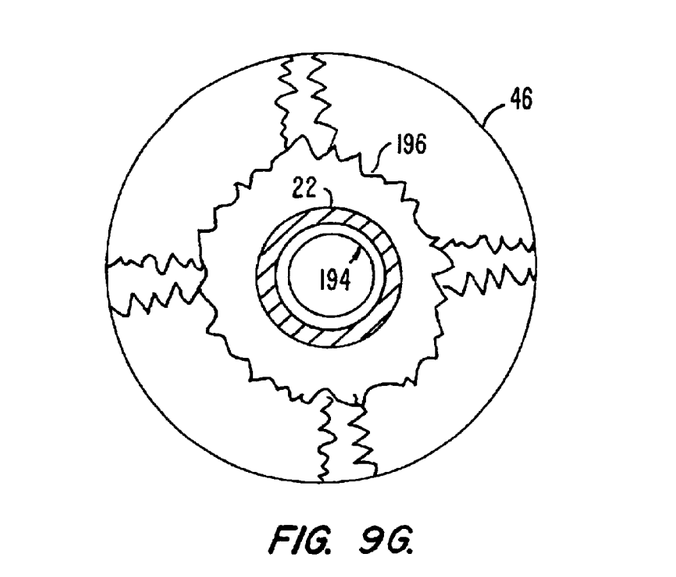
Figure 9H:
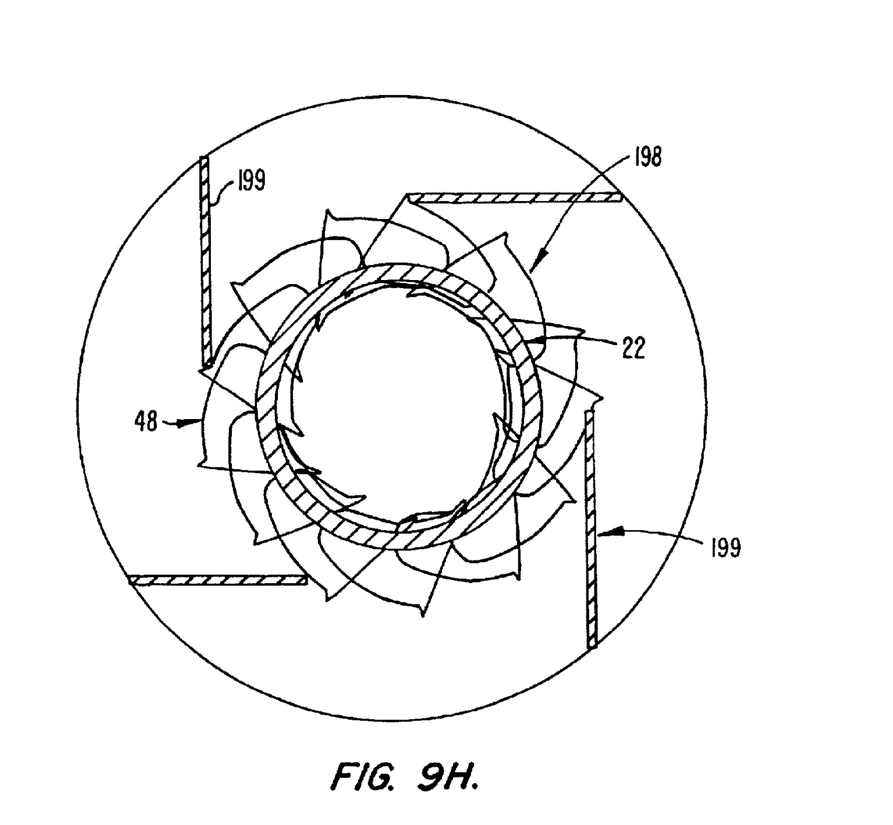

In FIG. 9D, electromagnets 188 and 190 are included outside of outer shell 46 in a manner similar to ECR plasma techniques. The embodiment shown in FIG. 9E includes a plurality of permanent magnets 192 spaced uniformly apart within toroidal core 48. In one particular embodiment where a fixed adjustment to the plasma spacial profile is desired, magnets 192 can be spaced approximately ½ to 1 inch apart and are either ceramic ferrites, neodymium magnets (NdFeB), samarium cobalt magnets (SmCo) or a similar permanent magnet. In FIG. 9F, arms 195 extending toward toroidal core 22 and toroidal cover 48 can be moved vertically within the chamber to adjust the plasma while in other embodiments shown in FIGS. 9G and 9H, toroidal core 22 and toroidal cover 48 can be moved horizontally. In the embodiment of FIG. 9G, which is a top cross-sectional view of the toroidal core 22 and toroidal cover 48 only the outer diameter of the torus is changed in a radial direction. In this embodiment, inner diameter 194 of toroidal cover 48 and toroidal core 22 itself remain in a fixed position and the plasma can be adjusted by moving the outer diameter 196 of toroidal cover 48. The outer wall of the torus is made to be a flexible, bellow that can be expanded or compressed as desired to adjust the plasma. In the embodiment of FIG. 9H, which also is a top cross-sectional view of the toroidal core 22 and cover 48, core 22 is fixed but toroidal cover 48 is made from a plurality of interleaving sealing sections 198 that can move similar to a camera iris in response to linear drives 199.

While the invention has been described above with respect to specific structures and process steps, it is understood that the invention is not limited to the described embodiments. In particular, alternative configurations of the cover, shape of the core, core materials, or placement of dielectric gaps, or use of other precursors or other process. These equivalents and alternatives are intended to be included within the scope of the present invention. Other variations will be apparent to persons of skill in the art.

Accordingly, it is not intended to limit the invention except as provided in the appended claims.

What is claimed is:

1. A substrate processing chamber comprising:

a housing that defines a vacuum chamber;

a power supply;

a toroidal plasma source contained within the vacuum chamber, said toroidal plasma source including a core;

a coupling structure configured to transfer energy from said power supply to said toroidal plasma source; and a substrate support member disposed to hold a substrate within said vacuum chamber such that a process surface of said substrate is opposite and essentially parallel to the core;

wherein said housing comprises a first interior chamber surface that separates said toroidal plasma source from said coupling structure; and wherein electric field lines generated by said toroidal plasma source are predominantly parallel to said first interior chamber surface.

2. The substrate processing chamber of claim 1 wherein said housing comprises a plurality of interior chamber surfaces including said first surface, a side surface and a top surface;

said substrate support member includes an upper surface that faces said toroidal plasma source; and said electric field lines are predominantly parallel to said first, side and top surfaces of said housing and said upper surface of said substrate support member.

3. The substrate processing chamber of claim 2 wherein the toroidal plasma source includes a core having a plurality of ferrite segments and a non-magnetic spacer having a selected thickness, the non-magnetic spacer being disposed between two of the plurality of ferrite segments.

4. The substrate processing chamber of claim 2 further comprising an RF generator mounted directly on the chamber and operatively coupled to said core without tunable matching circuitry.

5. The substrate processing chamber of claim 2 further comprising: a shaped member disposed between the toroidal plasma source and the process surface of the substrate, said shaped member having a bottom surface that is contoured to affect plasma density distribution.

6. The substrate processing chamber of claim 5 wherein the shaped member has an outer perimeter portion extending beyond a substrate edge.

7. The substrate processing chamber recited in claim 2 wherein:

said core laterally surrounds a center plasma conduit; and said plurality of interior chamber surfaces separates said toroidal plasma source from said center plasma conduit.

8. The substrate processing chamber recited in claim 7 further comprising a bottom plate disposed between said toroidal plasma source and said process surface of said substrate, said bottom plate comprising an open center portion that laterally surrounds the center plasma conduit.

9. The substrate processing chamber recited in claim 8 wherein the open center portion has a nonuniform cross section that decreases in thickness near the center plasma conduit.

* * * * *